CONNECTOR FOR COMPONENT AND PRINTED CIRCUIT BOARD

Filed Sept. 21, 1962

INVENTOR.
MICHAEL LAZAR

BY Ernest Janick

ATTORNEY

3,192,307
CONNECTOR FOR COMPONENT AND PRINTED CIRCUIT BOARD

Michael Lazar, White Plains, N.Y., assignor to Burndy Corporation, a corporation of New York
Filed Sept. 21, 1962, Ser. No. 225,232
2 Claims. (Cl. 174—68.5)

This invention relates to connections for circuit components and, more particularly, to means for connecting and mounting microminature circuit components in printed circuit boards.

While printed circuit boards have been in common use for some time, recently advances have been made in the design of components for use with these boards which have been difficult to package or assemble into usable configurations. For example, advanced types of microelectronic circuits are currently in production in which small pellet shaped circuits or components are assembled into small, very thin packages. These packages are then inserted into holes or cavities in a printed circuit board.

In the past the circuits were then connected to the printed circuit board conductor elements by soft soldering, resistance welding, or thermal compression bonding, or even in some cases through the use of conductive adhesives such as epoxy silver or epoxy gold pastes.

While all the previously known methods of connecting the microelectronic circuit to the printed circuit board were electrically satisfactory, they left much to be desired in their mechanical characteristics. The microelectronic circuit which was inserted into the body of the board had to withstand the same mechanical forces as the board itself but since the only connection between the component and the board was the electrical connection, it often failed under mechanical stress. In order to achieve mechanical stability often weight and size had to be sacrificed.

Therefore, one of the objects of this invention is to provide means for fastening microminiature circuit components to a printed circuit board to achieve a high package density.

Another object of this invention is to provide means for mechanically and electrically joining a microelectronic circuit element to a printed circuit board.

One of the features of this invention is the provision of a fastener having an adhesive surface which is mounted over the opening in a printed circuit board in which a microminiature component or circuit is disposed.

Another feature of this invention is to provide a connecting device having a predetermined conductive area which may be positioned over the opening in a printed circuit board containing a microminiature circuit element and utilized to join the lead of the element to the conductive portion of the board.

These and other objects and features of this invention will be made more apparent by reference to the following specification taken in conjunction with the accompanying drawings wherein.

Figure 2:
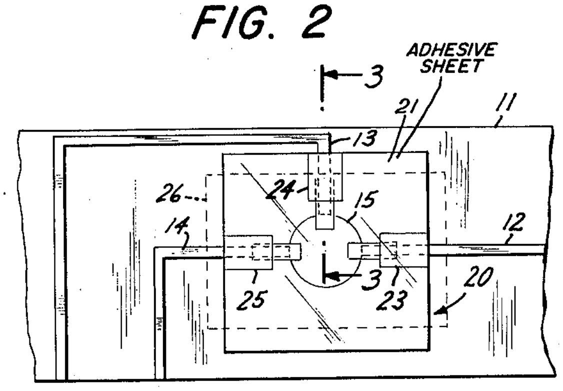
FIG. 2 is a plan view of the assembled connection utilizing the elements shown in FIG. 1.
Figure 4:
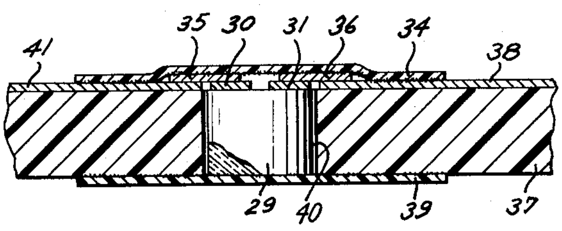
Figure 3:
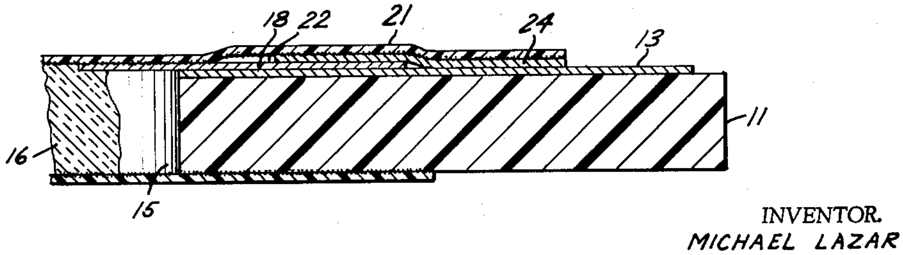

FIG. 3 is a cross sectional view of the connection shown in FIG. 2 taken along the lines 3—3; and FIG. 4 is an alternative embodiment of a connection in accordance with the principles of my invention shown in cross section. This shows a circuit component with conductive pad areas rather than leads. The metallized area on the tape bridges the gap between the pad and the circuit on the board.

Figure 1:
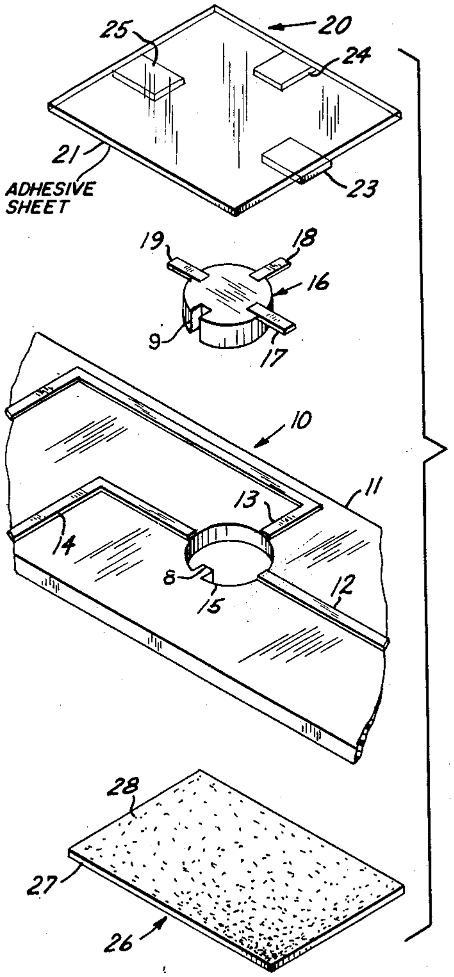
FIG. 1 is an exploded view in perspective of a printed circuit board and circuit component and fastener in accordance with the principles of this invention.

Referring to FIGS. 1–3 of the drawing, a printed circuit fastener-connector in accordance with the principles of this invention is therein shown for use with a printed circuit board 10 composed of an insulating base material 11. Disposed on the base 11 is a plurality of conductive leads 12, 13 and 14 which comprise the printed circuit and may be formed in any of the usual and known manners. Each lead 12, 13 and 14 terminates in an opening in the printed circuit board 15.

A microminiature component 16 or microelectronic circuit generally having a body size with a diameter of .050″ to .250″ may be disposed within the opening. The component 16 has electrically conducting leads 17, 18 and 19 extending therefrom. Obviously the component 16 may be of a shape other than circular and may include a peripheral keying opening 9 to coact with keying device 9 and properly orient the component in the hole 15. An upper element 20 having an insulating base 21 with one surface 22 covered with an adhesive and having a plurality of conductive areas 23, 24 and 25 disposed thereon is utilized to fasten the circuit component 16 within the board 10. A lower element 26 may also be utilized and is composed of an insulating base 27 having an adhesive disposed on one surface thereof. It is of course possible to provide polarizing means on element 20 and board 11 to properly orient the element relative to the board.

In use the fastener-connector of this invention is utilized by first disposing component 16 in hole 15 and orienting the leads 17, 18 and 19 so they overlie conductive surfaces 12, 13 and 14. The upper connector element 20 is disposed over the printed circuit board with the areas 23, 24 and 25 orienting and overlying leads 17, 18 and 19, and 12, 13 and 14. Pressure is applied to the adhesive to join the circuit component to the board. To add mechanical strength the lower pressure-sensitive connector element is applied to the lower portion of the printed circuit board. Of course, if desired, it is quite obvious that the circuit component 16 may also have leads on its lower face and the printed circuit board may include leads on its lower face and the lower element may be similar to the upper connector element 20.

Referring to FIG. 4 of this invention, an alternative embodiment is therein shown for use with a circuit component 29 having leads 30 and 31 which do not extend beyond its periphery. Circuit component 29 is designed to fit within the opening 40 of printed circuit board 37 on which is the printed conductor 38. The upper connector having an insulating base 34 faced with an adhesive and metallized areas 35 and 36 is utilized to join the metal contacts 30 and 31 to the printed conductors 41 and 38, respectively. In the usual manner the adhesive is utilized to join the insulated base and mechanically fasten the component 29 to the board 37. In addition a lower connector element comprising an insulating base 39 faced with an adhesive is used to add additional mechanical stability to the connector.

I have thus described my invention but I desire it understood that it is not confined to the particular forms or uses shown and described, the same being merely illustrative, and that the invention may be carried out in other ways without departing from the spirit of my invention, and therefore I claim broadly the right to employ all equivalent instrumentalities coming within the scope of the appended claims, and by means of which objects of my invention are obtained and new results accomplished since the particular embodiments herein shown and described are only some of the many that can be employed to obtain these objects and accomplish these results.

I claim:

1. In combination, a printed circuit board having an opening therein and a conductive element adjacent said opening, a circuit component disposed within said opening having a conductive lead connected thereto, a connector element formed of an insulating material having an adhesive coating on one side thereof and further including a conductive portion on said one side, said connector element being positioned over said circuit component and an adjacent area of said circuit board, with said conductive portion disposed over both said component lead and said conductive element, said connector element electrically joining said lead and said element and mechanically fastening said component in said opening to said board.

2. An electrical connection comprising a printed circuit board having an opening therein and a conductive element adjacent said opening, a circuit component having an electrical lead connected thereto disposed in said opening, a pair of connector elements each comprising an insulating material having an adhesive coating on one side thereof, at least one of said connector elements having a conductive surface portion on the same side as said adhesive coating; each of said connector elements being disposed over said opening with said adhesive engaging both said board and said component, and with said conductive surface portion electrically engaging said conductive element and said electrical lead.

References Cited by the Examiner

UNITED STATES PATENTS

| | | | |
|---|---|---|---|
| 2,964,587 | 12/60 | Minot | 174—117 |
| 3,061,762 | 10/62 | Schlegel | 317—101 |
| 3,077,511 | 2/63 | Bohrer et al. | 339—17 |
| 3,082,396 | 3/63 | Bernard | 339—186 X |

JOSEPH D. SEERS, *Primary Examiner.*

ALFRED S. TRASK, *Examiner.*